United States Patent [19]
Giramma et al.

[11] Patent Number: 5,805,859
[45] Date of Patent: Sep. 8, 1998

[54] DIGITAL SIMULATOR CIRCUIT MODIFIER, NETWORK, AND METHOD

[75] Inventors: David J. Giramma; Thomas E. Roth, both of Portland; Oliver W. Kozber, Beaverton; Michael G. Robinson, Portland; David K. Johnson, Aloha, all of Oreg.

[73] Assignee: Synopsys, Inc., Mountain View, Calif.

[21] Appl. No.: 477,149

[22] Filed: Jun. 7, 1995

[51] Int. Cl.$^6$ .............................. G06F 9/455; G06F 17/50
[52] U.S. Cl. .......................................................... 395/500
[58] Field of Search ............................ 395/500; 364/578, 364/488–491

[56] References Cited

U.S. PATENT DOCUMENTS

| | | |
|---|---|---|
| 3,902,050 | 8/1975 | Schmidt et al. . |
| 4,584,642 | 4/1986 | Fudanuki . |
| 4,635,218 | 1/1987 | Widdoes, Jr. . |
| 4,677,587 | 6/1987 | Zemany, Jr. . |
| 4,698,760 | 10/1987 | Lembach et al. . |
| 4,751,637 | 6/1988 | Catlin . |
| 4,769,817 | 9/1988 | Krohn et al. . |
| 4,787,061 | 11/1988 | Nei et al. . |
| 4,791,602 | 12/1988 | Resnik . |
| 4,827,427 | 5/1989 | Hyduke . |
| 5,168,455 | 12/1992 | Hooper . |
| 5,191,541 | 3/1993 | Landman et al. . |
| 5,210,700 | 5/1993 | Tom . |
| 5,253,363 | 10/1993 | Hyman . |
| 5,272,651 | 12/1993 | Bush et al. ............................... 364/578 |
| 5,384,720 | 1/1995 | Ku et al. ................................... 364/578 |
| 5,410,673 | 4/1995 | Oguri ....................................... 395/500 |
| 5,502,661 | 3/1996 | Glunz ....................................... 364/578 |

OTHER PUBLICATIONS

HAL: A High–Speed Logica Simulation Machine, Koike et al., IEEE, Oct. 1985.

Transition Density, a Stochastic measure of Activity in Digital Circuits, Najm, Farid N., IEEE Design Automation Conference, 1991.

Boolean Matching of Sequential Elements, Krishnamoorthy et al., Synopsys, Inc., 1995.

From Behavior to Structure: High–Level Synthesis, Camposano, IEEE Design and Test of Computers, 1990.

Cycle Simulation Techniques, Palnitkar et al., Sun Microsystems, Inc., 1995.

Compiling Verilog into Timed Finite State Machines, Cheng et al., IEE, 1995.

Primary Examiner—Kevin J. Teska
Assistant Examiner—Ayni Mohamed
Attorney, Agent, or Firm—Kolisch Hartwell Dickinson McCormack & Heuser

[57] ABSTRACT

Described is a circuit modifier, network, and method for use with an event-driven digital logic simulator for enforcing consistent evaluation of input pin changes at state elements. The invention automatically interposes a fictitious 0-delay defer agent or processor, at the input pin to state elements such as D Flip-Flops. The interposition of the defer agent is handled by the simulator as follows. Defer agents schedule events related to input state changes on a special time or task queue which is not processed until after all other events have been executed for the current time, including any extra iterations caused by 0-delay scheduling activity. Defer agents or processors are placed in a simulation network just prior to one or more of the input pins of state elements, the effect of which is to delay events that normally would propagate to the input pin of a state element until all other normal simulation events are processed. Once the normal simulation events have been executed, the defer events are executed which permits the inputs of the state elements to change after other simulation events have been executed, thereby ensuring consistent evaluation of pin changes at state elements.

29 Claims, 3 Drawing Sheets

DIGITAL SIMULATOR CIRCUIT MODIFIER, NETWORK, AND METHOD

CROSS REFERENCE TO RELATED APPLICATION

Assignee of this patent application, Synopsys, Inc., of Mountain View, Calif., is assignee of U.S. patent application Ser. No. 08/414,794, now U.S. Pat. No. 5,706,473 entitled A COMPUTER MODEL OF A FINITE STATE MACHINE, which was filed Mar. 31, 1995.

TECHNICAL FIELD

The present invention relates generally to digital system simulation. More specifically, it concerns digital logic simulators that model the logic values of outputs of objects based upon a state abstraction involving the objects' inputs and internal states. By object is meant any discretely modelled logic gate, circuit or system of any complexity, although typically an object includes a few logic gates having relatively few inputs and corresponding outputs.

BACKGROUND ART

Often, digital logic simulators include a simulation kernel for reading and processing a netlist, which consists of a list of simulatable models and the connections between them. Individual models within the logic simulator may describe relatively complex devices such as a field programmable gate array (FPGA) or a complex programmable logic device (CPLD), which typically are used with models of other devices, e.g., memories, microprocessors, etc., to simulate the behavior of the board or system. The simulation kernel performs a conventional event-driven simulation based upon the given description.

Generally, there are two classes of event-driven digital logic simulators: one-pass and two-pass. One-pass simulators use an algorithm that is inherently faster than two-pass simulators, but sometimes produce inconsistent results. The problem arises when multiple input pins of certain types of logic gates change state simultaneously, as is illustrated by the following pseudo-code of a typical one-pass simulation algorithm:

```
While there are still events at any tinie
    Acquire next time with events
    While there are still events at this time
        Acquire next event
        Update output of logic gate with new state from event
        While output has remaining connections to logic gate inputs
            Acquire next connected logic gate input
            Update state of input
            Evaluate connected logic gate to deterniine if output needs to
               change state
            If output needs to change then schedule output
        End while connections
    End while events at time
End while any events
```

Those skilled in the art will appreciate that, characteristically, the algorithm immediately evaluates whether a gate's output must change in response to a change of state of the gate's input pin. It is thus the input state updating step immediately followed by the connected logic gate evaluation step that can lead to inconsistent results when two input pins of the same logic gate change state at once, e.g., when the data input changes at the same time as the active clock edge arrives at the inputs of a D-type Flip-Flop. Because most simulators execute instructions sequentially, the state of the Q output of the D Flip-Flop would depend upon whether the data input change or the clock change were evaluated first. In short, the one-pass simulator is sensitive to the ordering of simultaneous events on a logic gate.

Two-pass simulators avoid this problem as is illustrated by the following pseudo-code of a typical two-pass simulation algorithm:

```
While there are still events at any time
    Acquire next time with events
    While there are still events at this time
        Acquire next event
        Update output of lOgiC gate with new state from event
        While output has remaining connections to logic gate inputs
            Acquire next connected logic gate input
            Update state of input
            Place connected logic gate on evaluation stack if not there already
        End while connection
    End while events at time
    While there are entries in the evaluation stack
        Acquire next evaluation stack entry
        Evaluate logic gate in entry to determine if output needs to
           change state
        If output needs to change then schedule output
    End while entries in stack
End while any events
```

Instead of evaluating the response of a gate to an input change immediately, as with the one-pass algorithms, two-pass algorithms place the gate on a stack for evaluation after all simulation events for that time have been processed. Using a two-pass algorithm in the above D Flip-Flop example, both the data and the clock inputs would have changed before the Q output were evaluated, thereby ensuring consistent results.

If, as a part of the evaluation process, a 0-delay event is scheduled, then the algorithm loops back and once again processes all remaining events for that time. This is called an iteration, and events that occur at the same time but in different iterations can cause inconsistent results even in a two-pass simulator. Although 0-delay elements are seldom used in digital logic simulation, nevertheless their use can produce inconsistent simulation results in those cases where it may be necessary to use 0-delay elements. Simulation results that are inconsistent cause users great confusion and frustration, and produce costly design delays.

DISCLOSURE OF THE INVENTION

Briefly, the invention automatically interposes a fictitious 0-delay buffer element referred to herein as a defer agent or processor, at the data input to state elements such as D Flip-Flops. The interposition of the defer agent is handled by the simulator as follows. Defer agents schedule events related to input state changes on a special time or task queue that will be referred to herein as a defer queue. Events in the defer queue are not processed until after all other events have been executed for the current time, including any extra iterations caused by 0-delay scheduling activity. Defer agents or processors are placed in a simulation network just prior to one or more of the input pins of state elements, the effect of which is to delay events that normally would propagate to the input pin of a state element until all other normal simulation events are processed. Once the normal simulation events have been executed, the defer events are executed. This permits the inputs of the state elements to change after other simulation events have been executed thereby ensuring consistent evaluation of pin changes at state elements. Consistent simulation results are produced, whether with a one-pass or two-pass algorithm, while adding only slight computational overhead to the one-pass algorithm.

These and additional objects and advantages of the present invention will be more readily understood after consideration of the drawings and the detailed description of the preferred embodiment.

DETAILED DESCRIPTION OF THE PREFERRED EMBODIMENT AND BEST MODE OF CARRYING OUT THE INVENTION

Figure 1:
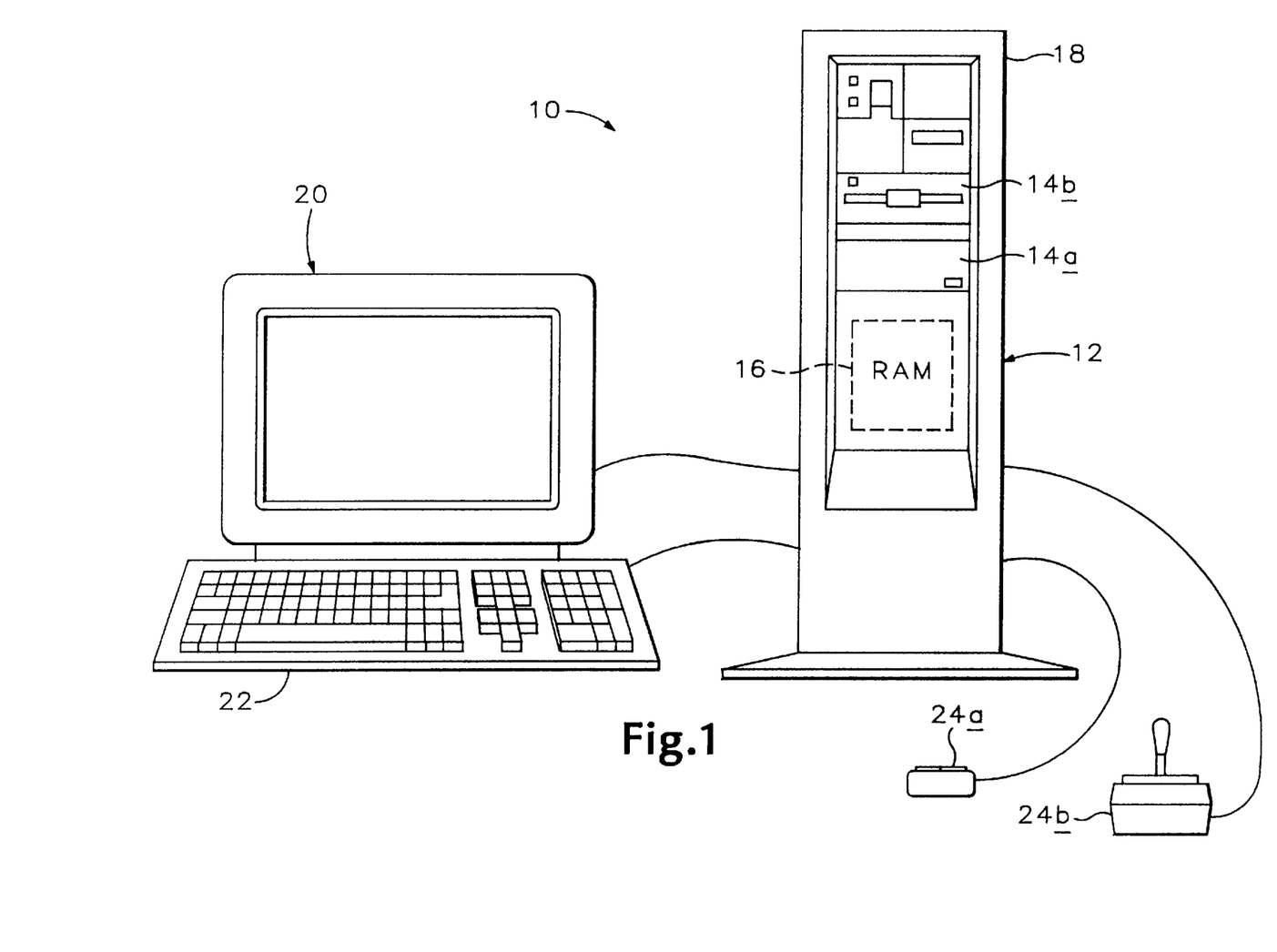
FIG. 1 is a conventional engineering workstation that may act as a hardware/firmware platform for a digital logic simulator and the invented circuit modifier, network and method, each of which forms a part thereof.

Referring first to FIG. 1, those of skill in the pertinent arts will appreciate that a digital logic simulator typically is a software application executing on an engineering workstation 10 or other general-purpose computer typically providing a digital processor 12 containing an arithmetic logic unit (ALU) and various registers typically including register stacks, scratchpad memories and accumulators. Skilled persons also will appreciate that the workstation also typically will provide for mass data storage, e.g., a hard or flex disk drive 14a, 14b or both, as well as a quantity of read-and-write semiconductor memory (RAM) 16 (shown in outline as residing within workstation 10 and its housing 18) in which such application programs reside for execution by digital processor 12. Finally, skilled persons will appreciate that the workstation also typically will provide a display means such as a video display terminal (VDT) 20, a keyboard 22 and an associated display cursor control system 24 including, for example, a mouse or joystick 24a, 24b, or both. Within the spirit and scope of the invention, such a workstation may be equipped with specialized hardware that accelerates the digital logic simulation process, or the digital logic simulator itself may be a special-purpose processor that is a combination of hardware and firmware dedicated to the task of digital logic simulation. All such conventional hardware, firmware and software-executing-on-a-hardware/firmware platform architectures for a digital logic simulator are contemplated, and all are within the spirit and scope of the invention.

The invented system and method provide for consistent evaluation of simultaneous pin changes at state elements without requiring the maintenance of, or processing of, an evaluation stack.

Figure 2:
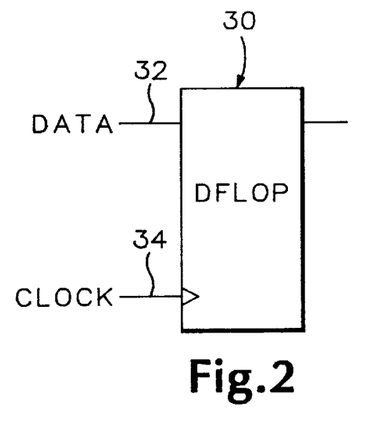
FIG. 2 is a block diagram of a sequential logic element known as a D Flip-Flop.

Illustrated generally at 30 in FIG. 2 is a so-called state element in the form of a conventional D Flip-Flop (DFlop). DFlop 30 is among a class of circuits known as sequential logic circuits. Sequential logic circuits, also known as regenerative circuits, are called such because the outputs of such circuits are dependent upon preceding values of input data. Such circuits find ready application in digital systems, some examples of which include clock counters, data registers, clock oscillators, and time delay circuits. A characteristic of such sequential circuits is that one or more output nodes are intentionally connected back to one or more of the inputs to give positive feedback, or regeneration.

Basic to sequential circuits is the bistable circuit, an example of which is DFlop 30. Such circuits may be implemented with Bipolar junction transistors (BJT), MOS field-effect transistors (NMOS), Complementary MOS (CMOS) or any other semiconductor technology.

The preferred embodiment of the invented modifier, network, and methods will be described, for illustrative purposes only, in conjunction with Dflop 30 or, more specifically, a model of DFlop 30 designed to be utilized by a digital logic simulator. It will be understood, however, that the invented modifier, network, and methods are useful in conjunction with other sequential logic circuits and elements such as Latches and the like, having any number of inputs and implemented by any suitable hardware, firmware, or software.

Figure 2A:
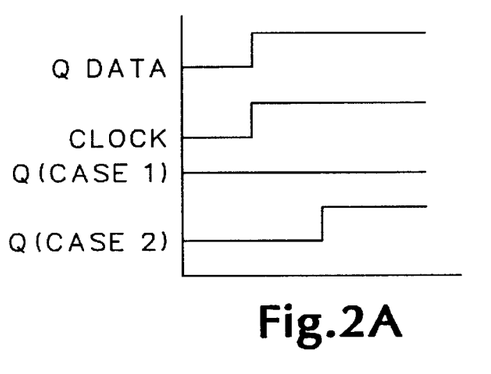
FIG. 2A is a graph showing input and output characteristics of the D Flip-Flop of FIG. 2.

As shown in FIG. 2, DFlop 30 includes Data pin 32, Clock pin 34, and Output pin Q. Data in the form of electronic signals are provided to Dflop 30 via pins 32, 34. In the case of pin 32, the data are in the form of high/low signals. In the case of pin 34, the data are in the form of high/low clock signals or pulses which enable or disable DFlop 30 depending upon the particular way in which the DFlop is configured. As an illustrative example of consistency problems arising from simultaneous input pin changes in one-pass evaluation, consider the situation in which Data pin 32 and Clock pin 34 change state simultaneously. This situation is shown in FIG. 2A where the Data and Clock inputs may be seen to rise at the same time. In such an instance, it is oftentimes unclear whether the old Data value will be clocked in (as in Case 1), or a new Data value will be clocked in (as in Case 2). Even though the input changes occur effectively simultaneously, one input change is necessarily processed before the other because of the sequential nature of the processing performed by a typical digital logic simulator. Thus, if Clock pin 34 should happen to change state first, then it will appear as if the Data value is still "0", and so DFlop 30 will remain at "0" (Case 1). If, however, Data pin 32 should happen to change first, then when the Clock pin changes later, the Data value will be at a "1" and DFlop 30 will clock in the "1" (Case 2).

Figure 3:
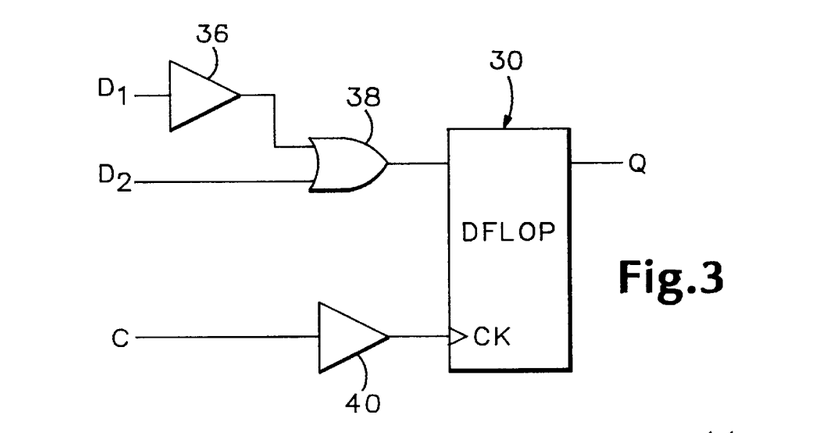
FIG. 3 is a block diagram showing the D Flip-Flop of FIG. 2 as part of a logic circuit

Another example of consistency problems stemming from simultaneous input pin changes is illustrated and discussed in conjunction with FIG. 3, where it may be seen that Data input $D_1$ is connected to a buffer 36, the output of which is coupled with Data input $D_2$ through OR gate 38, the output of which is fed to the Data input pin of DFlop 30. Clock input C may be seen to be connected to a buffer 40, the output of which is fed to the Clock input pin of DFlop 30. Assuming that buffers 36, 40 and OR gate 38 are 0-delay elements, if the Data and Clock signals at DFlop 30 change state at the same time, it is because either $D_1$ and C changed at the same time, or because $D_2$ and C changed at the same time. In the situation where $D_1$/C change at the same time, the Data change will arrive at DFlop 30 one iteration later than the Clock change, so the evaluation from the Clock change will capture the old state of Data (the value defined by the signal present at the Data input pin). In the situation where $D_2$/C change at the same time and the changes arrive at DFlop 30 in the same iteration, DFlop 30 will always acquire the new state of Data. These are inconsistent results for changes that occur in the same simulation time slot for either one-pass or two-pass evaluations.

Figure 4:
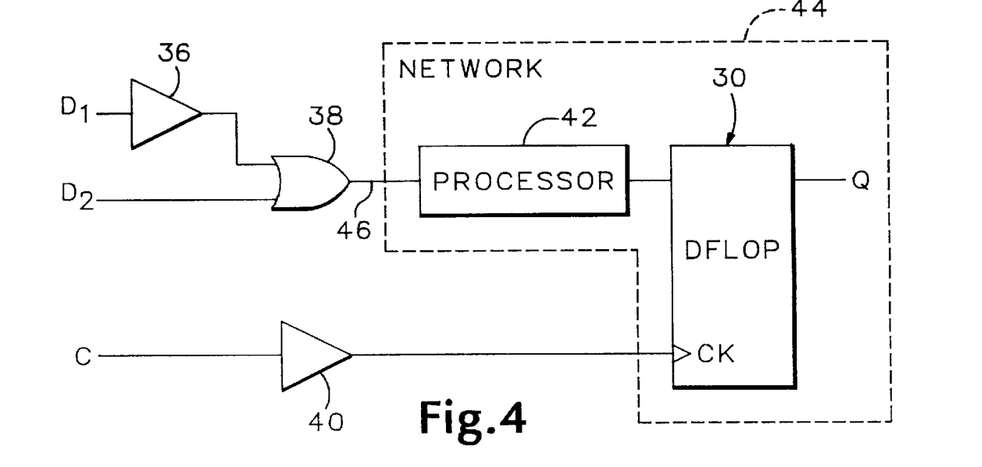
FIG. 4 is a block diagram similar to the diagram in FIG. 3, showing the preferred embodiment of the present invention as part of the logic circuit.

Illustrated in FIG. 4 at 42 is a processor, also referred to herein as a delay agent or circuit modifier, according to the preferred embodiment of the present invention. Processor 42 provides for consistent evaluation of pin changes in state elements and addresses the particularly nettlesome situation arising when two input pins change state simultaneously, as will be described below. Processor 42 may be seen as an element of a network 44 which includes DFlop 30. It will be understood that network 44 may include any suitable sequential logic element or elements with little modification to the placement of processor 42 within the network. It will further be understood that network 44 may include more than one processor or circuit modifier associated with an input of a logic element, and that the input (and input pin) with which such additional modifier is (are) associated is (are) different from an input with which any other circuit modifier is associated. The effect of such plural circuit modifiers is to provide deferred input to logic element 30 (used in its generic sense, and not necessarily only referring to a DFlop), so that not only is deferred input provided to element 30 by a modifier, but such deferred input, as between the plural modifiers, is ordered.

DFlop 30 in FIG. 4 may be seen to include plural inputs $D_1$, $D_2$, although it will be understood that DFlop 30 (and more generally, any logic element forming a part of network 44), may have any number of inputs.

An input or first connector 46 is operatively coupled to Data inputs $D_1$, $D_2$ through OR gate 38 and buffer 36 and defines therefrom a data path along which data, related to input changes, is provided to processor 42. Data received by processor 42 along the data path is processed and provided to DFlop 30 at a defined time which is described in more detail below. It will be understood, for now, that such defined time is after other simulation events for a given time have been evaluated by the simulator, including changes on the clock line. An output or second connector 48 connects processor 42 to the Data input pin of DFlop 30 and defines a data path therebetween, along which data is provided to DFlop 30 which is deferred, in a sense, having been evaluated or executed by the processor after a defined time during which other simulation events are executed.

As mentioned above, processor 42 receives data along connector 46 which is related to an input change at one or more of the inputs, and processes such data in the form of a defined event, the event being defined by the input change. Such defined events, it will be appreciated, are evaluated by processor 42 as 0-delay activities. By 0-delay activities are meant those activities which are simulated without modeling real time delay, treating the real time delay as if it were effectively zero. It will further be appreciated, as mentioned above, that processor 42 may be implemented by any suitable hardware, firmware, or software-programmed routine executable for example on workstation 10 in FIG. 1, and in the preferred embodiment is a software application executable on a suitable hardware platform.

Figure 5:
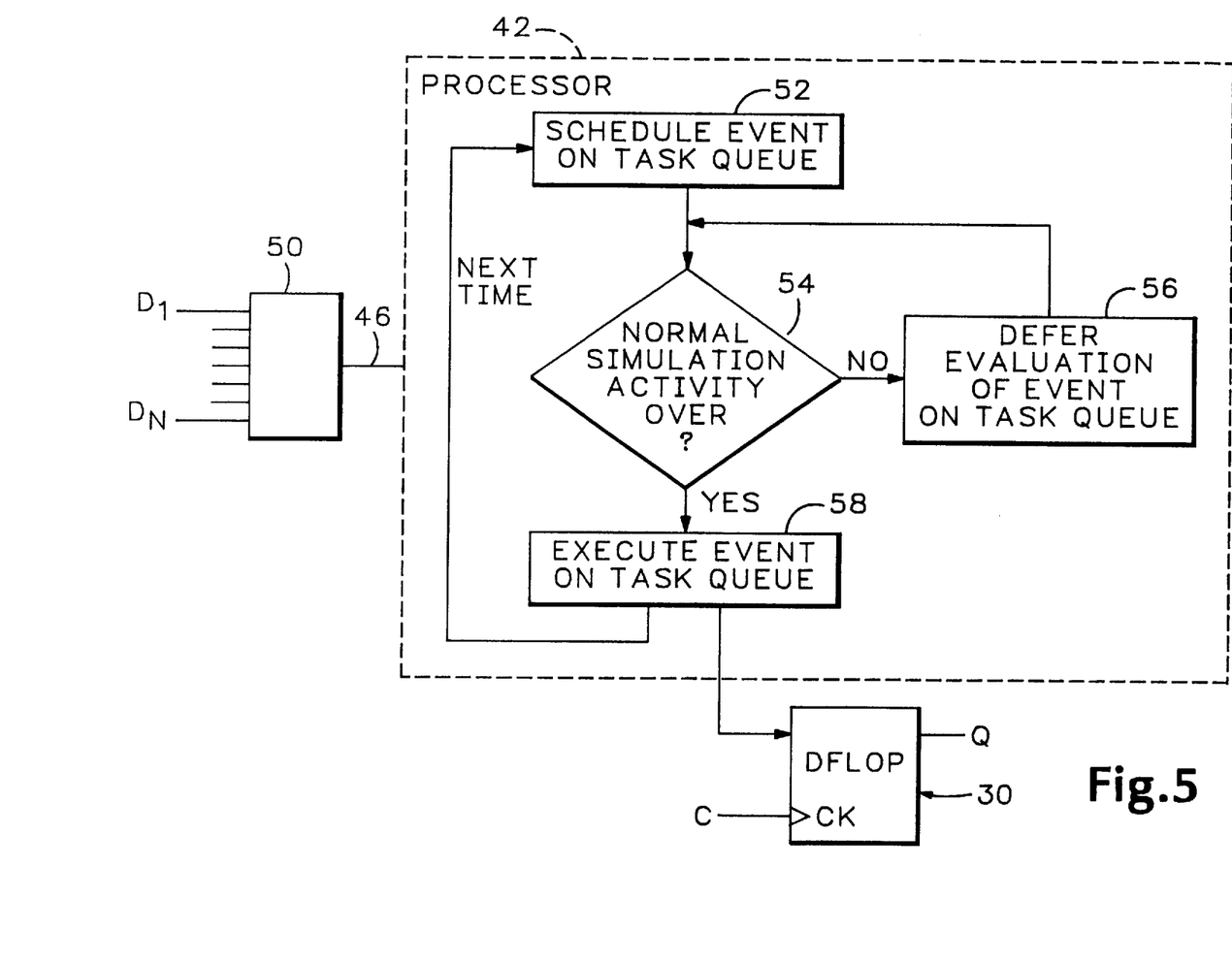
FIG. 5 is a block diagram/flow chart depicting in more detail the preferred embodiment of the present invention.

Processor 42 is shown in more detail in FIG. 5, in the form of a block diagram/flow chart. As shown, plural data inputs $D_1$ through $D_N$ are connected to what will be referred to generically as a combinational element 50 which may be any suitable combination of logic elements, buffers, etc., of any size, level, or complexity. First connector 46 couples element 50 with processor 42 and provides the data path as described above. Processor 42 effectively delays or holds up events which would normally propagate to the input pin of DFlop 30 along second connector 48, until all other normal simulation events for a given time slot have been processed. Of course, the same may be said when there is more than one processor operatively associated with a particular logic element. That is, the overall effect of the plural processors is to hold up events that would normally propagate to each respective input pin with which a processor is associated. However, as to the processors themselves, it will be appreciated that there is a separate deferral or ordering of the inputs provided during a given time after simulation events have been executed.

More specifically, and referring to the situation in which only one processor is present, for any given time t, and as illustrated at step 52, the processor schedules an event (related to a data input change) on a special time or task queue. It will be appreciated that the processor may itself be scheduled on the queue. At step 54, processor 42 checks to determine whether other normal simulation activities or events have concluded for the given time. Such other events, in the present example, are related to state changes at the Clock input pin and involve the evaluation or execution of events causally related to such state changes. If normal simulation activity for a given time is not complete, then the processor, at step 56, defers evaluating the events on the task queue. If, however, normal simulation activity for a given time has concluded, then the processor, at step 58, executes or evaluates the events on the task queue, and provides data representative of such processed or executed events to DFlop 30 along second connector 48. In the present example such data would be provided after the Clock pin changes state thereby ensuring that the Data pin changes always occur after the Clock pin changes.

It will be appreciated from the above description that the preferred embodiment of the present invention provides a method for use with a digital simulator in an event-driven simulation, for enforcing consistent evaluation of a sequential logic element in the simulator, which logic element includes plural Data inputs coupled to at least two input pins comprising the steps of: (1) defining a processor for scheduling and executing defined events which are characterized, at least in part, by a state change at an input; (2) interconnecting or linking the processor between at least one of the inputs and the input pin to which such input is coupled, leaving at least one other input unlinked to the processor; (3) processing an event in response to a state change at an input to which the processor is interconnected; and, (4) providing data representative of such processed event to the logic element at a definedly later time which is after a state change at an input pin to which the processor is not connected or linked. It will be appreciated that the data provided by the processor to the logic element may be considered to have been processed in response to a state change at an input to which the processor is not linked, and further that such pre-processed data was provided to the processor earlier, in response to a state change at the processor's linked input. In the preferred embodiment the processing step is carried out in part by scheduling the event onto a task queue which is processed after all other events for a given time are processed by the simulator. In the illustrative example above, processor 42 is interconnected to the data input pin of DFlop 30. It will be appreciated that processor 42 may be interconnected to the Clock input pin, say for instance, if logic element 30 were a Latch, in which case the Clock change would be held up until the data reached the element. Additionally, as discussed above, with some logic elements it will be desirable to incorporate more than one processor for the purpose of deferring input at more than one pin of a simulated logic element. In this situation, the plural processors effectively defer the input to any such pins with which they are associated, providing however, an ordered input as between processors, after the execution of simulation events for a given time.

Another way of describing the invention is to recognize that, broadly speaking, one method of the present invention according to the preferred embodiment involves modifying the design of at least one state element model, when that model is instantiated into the simulation kernel described above. More specifically, the method may be described in conjunction with its use on a computer system which includes at least one memory location and includes the steps of: (1) storing a description of a circuit in a memory location; (2) reading (or compiling) the description of the circuit in the memory location; (3) determining (or identifying during such compiling) the occurrence of at least one description of at least one state element in the circuit description; and, (4) delaying at least one input to at least one determined state element until definable simulation events have been executed by the simulator. In the preferred embodiment, the delaying step includes the step of modifying the circuit description, which is preferably a textual description stored in memory, in response to the determined occurrence of at least one state element. Further, the modifying step may be accomplished, in part, by defining at least one defer queue onto which simulation events may be scheduled; defining at least one defer agent for scheduling (or being scheduled) onto an associated defer queue in response to simulation events; and, associating at least one defer agent with the description of at least one state element input, for effectively deferring input thereto. Hence, the delaying step may be completed by the computer system processing the events on the defer queue after certain simulation activity for a given time has been executed.

The above modifier, network and methods, in the preferred embodiment, are preferably implemented on a computer system having a digital logic simulator for performing event-driven simulation which system includes a data structure, such as a memory location, accessible by the simulator, for storing textual descriptions of logic circuits, which descriptions include a description of at least one state element. A controller (described above as a processor and its associated queue) is coupled to the data structure for accessing the stored circuit description of one or more of the logic circuits, and determining the occurrence of at least one state element description for a given circuit. In response to determining the occurrence of such a description, the controller is capable of modifying the circuit description by associating a processor and a queue with such element description wherein the processor is capable of scheduling (or being scheduled) onto the queue for a given time, and determining when other simulation events for a given time have been executed by the simulator. The processor is then capable of executing the events on the queue such that the input to such state element is delayed for a defined time during which simulation events are executed by the simulator.

Accordingly, while the present invention has been shown and described with reference to the foregoing preferred method and apparatus, it will be apparent to those skilled in the art that other changes in form and detail may be made therein without departing from the spirit and scope of the invention as defined in the appended claims.

We claim:

1. For use with a digital logic simulator and a state element model having plural inputs operatively associated with at least two input pins, a circuit modifier comprising:

a first connector operatively coupled to at least one of the inputs of the state element model and defining a data path therefrom;

a processor connected to the first connector for receiving data along said data path, such data being related to an input change at such coupled inputs, and executing defined events, such defined events being related to such received data; and a second connector coupling said processor to an input pin of the state element model and defining a data path therebetween for providing data from said processor to the element model, such provided data being related to the executing of events by said processor, with such data being provided to the element model at a defined time which is after a state change at another input pin of the element model, such other input pin not being coupled to said second connector, whereby said processor operates to delay the provision of such data to the element model, thereby to ensure consistent simulation results in the event of simultaneous input pin changes.

2. The modifier of claim 1, wherein said second connector is coupled to a Data input pin.

3. The modifier of claim 1, wherein said second connector is coupled to a Clock input pin.

4. For use with a digital logic simulator and a state element model having plural inputs operatively associated with at least two input pins, a circuit modifier comprising:

a first connector operatively coupled to at least one of the inputs of the state element model and defining a data path therefrom;

a processor connected to the first connector for receiving data along said data path, such data being related to an input change at such coupled inputs, and executing defined events, such defined events being related to such received data;

a second connector coupling said processor to an input pin of the state element model and defining a data path therebetween for providing data from said processor to the element model, such provided data being related to the executing of events by said processor, with such data being provided to the element model at a defined time which is after a state change at another input pin of the element model, such other input pin not being coupled to said second connector; and at least one additional processor having an associated first and second connector, wherein said first connector is operatively coupled to, and defines a data path from, at least one of the inputs of the state element model which is different from the inputs to which any other processor(s) is (are) coupled, and wherein said second connector couples said additional processor to an input pin of the state element model and defines a data path therebetween for providing data to the element model, such provided data from said additional processor being related to the executing of events by said additional processor, and wherein the execution of events by all of the processor is ordered with respect to one another.

5. The modifier of claims 2, 3, or 4, wherein at least one processor includes a task queue onto which such defined event(s) is (are) scheduled for evaluation as an 0-delay activity.

6. The modifier of claim 4, wherein said processor includes a task queue onto which such defined event(s) is (are) scheduled for evaluation as a 0-delay activity and wherein the defined time is after simulator evaluation of other events which are different from the defined events and related to the state change at an input pin which is not coupled to a second connector.

7. For use with a digital logic simulator, a network for providing consistent evaluation of input pin changes comprising:

at least one sequential logic element model having plural inputs and at least two input pins to which such inputs are connected; and a processor operatively coupled between at least one of the inputs and one of the input pins of the logic element model for scheduling and executing defined events which are characterized, at least in part, by an input change, and further wherein representative data of such defined events are provided to said logic element model at the input pin to which the processor is coupled, at a definedly later time, after other events that are different from the defined events and that are related to input changes at the input pin to which the processor is not coupled have been evaluated by the simulator, said processor effectively adding a 0-delay element between the at least one of the inputs and the one of the input pins of the logic element model thereby to ensure consistent simulation.

8. The network of claim 7, wherein said at least one input pin is a Data input pin.

9. The network of claim 7, wherein said at least one input pin is a Clock input pin.

10. For use with a digital logic simulator, a network for providing consistent evaluation of input pin changes comprising:

at least one sequential logic element model having plural inputs and at least two input pins to which such inputs are connected;

a processor operatively coupled between at least one of the inputs and one of the input pins of the logic element model for scheduling and scheduling defined events which are characterized, at least in part, by and input change, and further wherein representative data of such defined events are provided to said logic element model at the input pin to which the processor is coupled, at a definedly later time, after other events which are different from the defined events and related to input changes at the input pin to which the processor is not coupled, have been evaluated by the simulator; and at least one additional processor coupled between at least one of the inputs and one of the input pins of the logic element for scheduling and executing defined events which are characterized, at least in part by an input change, and wherein the inputs and pins between which such additional processor are coupled are different from the inputs and pins between which any other processor(s) is (are) coupled, such additional processor functioning to provide data which is representative of such defined events at a definedly later time after other events, which other events are different from the defined events and related to input changes at the input pin to which the processors are not coupled, have been evaluated by the simulator, and further wherein data provided by all of said processor is ordered with respect to one another.

11. The network of claims 8, 9, or 10, wherein at least one of said processors includes a task queue onto which such defined events are scheduled for subsequent execution by the simulator.

12. The network of claim 7, wherein at least one sequential logic element model is a Flip-Flop.

13. The network of claim 7, wherein at least one sequential logic element model is a Latch.

14. A method for use with a digital logic simulator for enforcing consistent evaluation of a sequential logic element model in the simulator, which element model includes plural inputs coupled to at least two input pins, the method comprising the steps of:

defining at least one processor for scheduling and executing defined events which are characterized, at least in part, by a state change at an input;

interconnecting a processor between at least one of the inputs and the input pin to which such input is coupled;

processing at least one event in response to a state change at an input to which said at least one processor is interconnected; and providing data representative of such processed event to the logic element at a definedly later time which is after a state change at an input pin to which said at least one processor is not connected, whereby said processing effectively delays the provision of such data to the logic element.

15. The method of claim 14, wherein said processing step is carried out, in part, by scheduling an event onto a task queue which is processed by the processor after all other events for a given time are processed by the simulator.

16. The method of claims 14 or 15, wherein the input pin to which a processor is interconnected includes a Data input pin.

17. The method of claims 14 or 15, wherein the input pin to which a processor is interconnected includes the Clock input pin.

18. A method for use with a digital logic simulator for enforcing consistent evaluation of a sequential logic element model in the simulator, which element model includes plural inputs coupled to at least two input pins, the method comprising the steps of:

defining at least one processor for scheduling and executing defined events which are characterized, at least in part, by a state change at an input;

interconnecting a processor between at least one of the inputs and the input pin to which such input is coupled;

processing at least one event in response to a state change at an input to which said at least one processor is connected, wherein said processing step is carried out, at least in part, by scheduling an event onto a task queue which is processed by the processor after all other events for a given time are processed by the simulator and wherein said processing step includes scheduling a defined event as a 0-delay activity.

19. In a digital logic simulator, a method for evaluating a sequential logic element in response to events characterized by state changes at one or more of the element's inputs comprising the steps of:

defining at least one processor for receiving data which is representative of a state change at a logic element input;

linking a processor to at least one of the element's inputs, leaving at least one other input unlinked to the processor;

inputting data into a linked processor in response to a state change at the processor's linked input;

processing such data in response to a state change at an unlinked input; and outputting such processed data to the logic element at a defined time, wherein the defined time is after the state change at the unlinked input has been executed by the simulator.

20. A method for modeling a circuit in an event-driven digital logic simulator on a computer system which includes at least one memory location the method comprising the steps of:

storing a description of a circuit in a memory location in the computer system, which description includes a description of at least one state element;

reading the description of the circuit in the memory location;

determining the occurrence of at least one description of at least one state element in the circuit description; and delaying at least one input to at least one determined state element until definable events have been executed by the simulator, wherein said delaying step includes the step of modifying the circuit description in response to the determined occurrence of at least one state element, wherein said modifying step includes the steps of:

defining at least one defer queue onto which simulation events may be scheduled;

defining at least one defer agent for scheduling onto an associated defer queue; and associating at least one defer agent with the description of at least one state element input.

21. The method of claim 20, wherein said delaying step includes the step of scheduling the defer agent onto a defer queue in response to simulation events.

22. The method of claim 20, wherein said storing step includes storing a textual description of the circuit in the memory location.

23. The method of claim 22, wherein said reading step includes the steps of:

accessing the textual description of the circuit in the memory location;

compiling the textual description of the circuit; and storing the compiled description of the circuit in a memory location.

24. A method for modeling a circuit in an event-driven digital logic simulator on a computer system which includes at least one memory location, the method comprising the steps of:

storing a description of a circuit in a memory location in the computer system, which description includes a description of at least one state element;

reading the description of the circuit in the memory location;

determining the occurrence of at least one description of at least one state element in the circuit description; and delaying at least one input to at least one determined state element until definable events have been executed by the simulator, wherein said delaying step further includes the step of the computer system processing the events on the defer queue after simulation activity for a given time has been executed.

25. A computer-assisted method for modeling a circuit in an event-driven digital logic simulator on a computer system which includes at least one memory location, and wherein a computer-readable description of such circuit is saved in a memory location in the system, the method comprising the steps of:

accessing the circuit description in such memory location;

compiling the accessed circuit description;

identifying, during such compiling, a description of at least one state element; and modifying the circuit description in relation to such identified state element so that the modified circuit description adds a defer agent along the path of an input to such identified state element such that input thereto is deferred for a defined time during which simulation events are executed by the computer system, wherein said modifying step is accomplished, in part, by the steps of:

defining at least one queue onto which simulation events may be scheduled for execution;

defining at least one defer agent for scheduling onto a queue in response to simulation events; and associating a defer agent with at least one identified state element input for the purpose of scheduling simulation events relative to such state element onto an associated queue for subsequent processing by the system.

26. The method of claim 25 further comprising the step of the computer system processing the scheduled events on a queue after simulation activity for a given time has been executed.

27. A computer system having a digital logic simulator for performing event-driven simulation comprising:

a data structure for storing descriptions of logic circuits which include a description of at least one state element, and wherein the circuit description is accessible by the simulator for performing event-driven simulation thereon; and a controller coupled to the data structure for accessing the stored circuit descriptions of one or more of such logic circuits, and determining the occurrence of at least one state element description for a given circuit therein, and further, in response to such determined occurrence of a state element description, for modifying the circuit description such that one input to such state element is delayed for a defined time during which such later time a changes on other inputs to the state element that are not so deferred have been evaluated, wherein the controller includes a processor and a queue operatively associated therewith, and wherein the controller modifies a circuit description of a state element by associating a processor and a queue with such element description, wherein the processor is capable of scheduling simulation events onto the queue for a give time, and of determining when other simulation events for a given time have been executed by the simulator, the processor then executing the events on the queue.

28. For use with a digital logic simulator and a state element model having plural inputs operatively associated with at least two input pins, a circuit modifier comprising:

a first connector operatively coupled to at least one of the inputs of the state element model and defining a data path therefrom;

a processor connected to the first connector for receiving data along said data path, such data being related to an input change at such coupled inputs, and executing defined events, such defined events being related to such received data, wherein said processor includes a task queue onto which such defined event(s) is (are) scheduled for evaluation as a 0-delay activity;

a second connector coupling said processor to an input pin of the state element model and defining a data path therebetween for providing data from said processor to the element model, such provided data being related to the executing of events by said processor, with such data being provided to the element model at a defined time which is after a state change at another input pin of the element model, such other input pin not being coupled to said second connector, wherein the defined time is after simulator evaluation of other events which are different from the defined events and related to the state change at an input pin which is not coupled to a second connector and wherein said second connector is coupled to a Data input pin.

29. For use with a digital logic simulator and a state element model having plural inputs operatively associated with at least two input pins, a circuit modifier comprising:

a first connector operatively coupled to at least one of the inputs of the state element model and defining a data path therefrom;

a processor connected to the first connector for receiving data along said data path, such data being related to an input change at such coupled inputs, and executing defined events, such defined events being related to such received data, wherein said processor includes a task queue onto which such defined event(s) is (are) scheduled for evaluation as a 0-delay activity;

a second connector coupling said processor to an input pin of the state element model and defining a data path therebetween for providing data from said processor to the element model, such provided data being related to the executing of events by said processor, with such data being provided to the element model at a defined time which is after a state change at another input pin of the element model, such other input pin not being coupled to said second connector, wherein the defined time is after simulator evaluation of other events which are different from the defined events and related to the state change at an input pin which is not coupled to a second connector and wherein said second connector is coupled to a Clock input pin.

* * * * *